(12) United States Patent
Rocklein et al.

(10) Patent No.: US 8,760,845 B2
(45) Date of Patent: Jun. 24, 2014

(54) CAPACITOR DIELECTRIC COMPRISING SILICON-DOPED ZIRCONIUM OXIDE AND CAPACITOR USING THE SAME

(75) Inventors: Noel Rocklein, Boise, ID (US); Vishwanath Bhat, Boise, ID (US); Chris Carlson, Nampa, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 83 days.

(21) Appl. No.: 13/370,312

(22) Filed: Feb. 10, 2012

(65) Prior Publication Data

US 2013/0208403 A1   Aug. 15, 2013

(51) Int. Cl.
*H01G 4/06* (2006.01)
*H01G 4/10* (2006.01)

(52) U.S. Cl.
USPC ........................... 361/321.5; 361/322

(58) Field of Classification Search
USPC .............................. 361/321.5, 322
See application file for complete search history.

(56) References Cited

U.S. PATENT DOCUMENTS

| | | | | |
|---|---|---|---|---|
| 7,312,127 | B2* | 12/2007 | Lo et al. | 438/285 |
| 7,629,243 | B2* | 12/2009 | Ino et al. | 438/591 |
| 2007/0117333 | A1* | 5/2007 | Yoon et al. | 438/296 |
| 2007/0252232 | A1* | 11/2007 | Ino et al. | 257/499 |

FOREIGN PATENT DOCUMENTS

| | | | |
|---|---|---|---|
| JP | 2008066668 A | * | 3/2008 |
| TW | 200605272 | | 2/2006 |
| TW | 200727405 | | 7/2007 |

OTHER PUBLICATIONS

T. Ino, et al "Dielectric Constant Behavior or Oriented Tetragonal Zr—Si—O System," Extended Abstracts of the 2006 International Conference on Solid State Devices and Materials, Yokohama, 2006. pp. 404-405.*
Tomida et al., Dielectric constant enhancement due to Si incorporation into HfO2, 2006, Applied Physics Letters 89, 142902.*

* cited by examiner

*Primary Examiner* — David M Sinclair
(74) *Attorney, Agent, or Firm* — Winston Hsu; Scott Margo

(57) ABSTRACT

A capacitor structure includes a storage node; a capacitor dielectric on the storage node; and a plate electrode on the capacitor dielectric. The capacitor dielectric may include a Si-doped ZrO2 layer or crystalline ZrSiOx with a Si/(Zr+Si) content ranging between 4-9% by atomic ratio. The capacitor structure further includes an interfacial TiO2/TiON layer between the storage node and the capacitor dielectric.

4 Claims, 1 Drawing Sheet

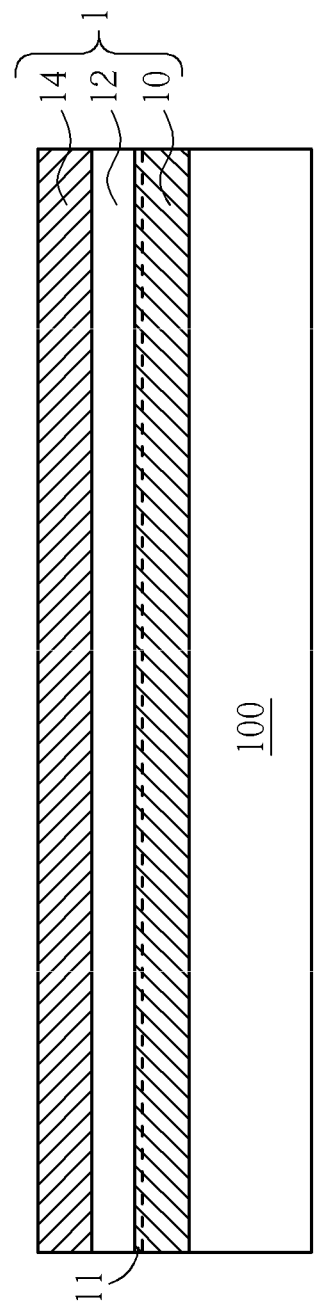

CAPACITOR DIELECTRIC COMPRISING SILICON-DOPED ZIRCONIUM OXIDE AND CAPACITOR USING THE SAME

BACKGROUND OF THE INVENTION

1. Field of the Invention

The present invention relates generally to semiconductor devices. More particularly, the present invention relates to a high-permittivity, low-leakage capacitor dielectric comprising silicon-doped zirconium oxide, and a capacitor having such capacitor dielectric.

2. Description of the Prior Art

As semiconductor devices such as dynamic random access memory (DRAM) devices have been highly integrated, sizes of unit cells have been greatly reduced and an operation voltage level has been lowered. One approach to increasing the capacitance is to increase the dielectric constant of the capacitor dielectric. To provide sufficient charge to be stored on smaller and smaller cell areas, high permittivity metal oxides have been studied and some are used as the capacitor dielectric. Examples of such high-permittivity metal oxides include HfO2 and ZrO2. HfO2 has higher dielectric constant compared to SiO2 and Al2O3, however, it exhibits higher leakage current. To reduce the leakage current, the capacitor dielectric film has to be formed thicker, which in turn reduces the capacitance of the capacitor structure.

The typical ZrO2 (pure) or ZrO2-Al2O3 system has reduced leakage current compared to HfO2, presumably due to that Al2O3 in the ZrO2-Al2O3 or ZrO2-Al2O3-ZrO2 dielectric stack can disrupt crystalline grain boundaries of the crystalline ZrO2, and Al2O3 or ZrAlOx can maintain amorphous phase. However, the discrete Al2O3 layer on the other hand causes a large reduction in the effective permittivity (or total capacitance of the dielectric stack), thereby limiting the amount of charge storage and preventing further miniaturization. It is also difficult to scale the ZrO2 component thinner to achieve higher capacitance because it becomes increasingly difficult to crystallize thinner ZrO2 layers towards high permittivity performance without strong leakage degradation due to excess thermal treatments.

Further, in the field of DRAM technology, it has been found that pure ZrO2 often "buckle off" TiN double-sided containers, resulting in dielectric damage and leakage flier behavior. Accordingly, there is a need in this industry to provide an improved capacitor dielectric without the above-described shortcomings.

SUMMARY OF THE INVENTION

It is one objective of the present invention to provide a high-permittivity, low-leakage capacitor dielectric and a capacitor using the same in order to solve the above-mentioned prior art problems.

According to one aspect of this invention, a capacitor dielectric includes a Si-doped ZrO2 layer with a Si/(Zr+Si) content ranging between 4-9% by atomic ratio. The Si-doped ZrO2 layer does not contain Al2O3.

According to another aspect of this invention, a capacitor dielectric consists of a crystalline ZrSiOx having a Si/(Zr+Si) content ranging between 4-9% by atomic ratio. The crystalline ZrSiOx may have a stochiometry of Zr(0.96 to 0.91)Si(0.04 to 0.09)O2.

According to still another aspect of this invention, a capacitor structure includes a storage node; a capacitor dielectric on the storage node; and a plate electrode on the capacitor dielectric. The capacitor dielectric may include a Si-doped ZrO2 layer or crystalline ZrSiOx with a Si/(Zr+Si) content ranging between 4-9% by atomic ratio. The capacitor structure may further comprise an interfacial TiO2/TiON layer between the storage node and the capacitor dielectric.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGURE is a schematic, cross-sectional diagram showing a portion of a DRAM capacitor structure having a high-permittivity, low-leakage capacitor dielectric comprising silicon-doped zirconium oxide in accordance with one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

With regard to the fabrication of integrated circuit devices, the term "major surface" refers to that surface of the semiconductor layer in and about which a plurality of devices are fabricated, e.g., in a planar process. As used herein, the term "vertical" means substantially orthogonal with respect to the major surface. Typically, the major surface is along a <100> plane of a monocrystalline silicon layer on which a field-effect transistor devices are fabricated.

The present invention pertains to a high-permittivity, low-leakage dielectric comprising silicon-doped zirconium oxide, which is particularly suited for capacitor dielectrics. The high-permittivity dielectric helps allow continued scaling of DRAM architecture, providing sufficient charge to be stored on smaller and smaller cell areas, leading to higher density chips and increased chips per wafer. It is to be understood that the embodiments and figures are for illustration purposes only. Those skilled in the art should understand the high-permittivity, low-leakage dielectric described in the embodiments is not limited to the DRAM applications, but may be applicable to various technical fields.

FIGURE is a schematic, cross-sectional diagram showing a portion of a capacitor structure having a high-permittivity, low-leakage capacitor dielectric comprising silicon-doped zirconium oxide in accordance with one embodiment of this invention. As shown in FIGURE, the capacitor structure 1 may be fabricated on a base layer 100 such as a semiconductor substrate or an inter-layer dielectric, but should not be limited thereto. According to the embodiment, the capacitor structure 1 comprises a storage node electrode 10, a capacitor dielectric 12 laminated on the storage node electrode 10, and a plate electrode 14 laminated on the capacitor dielectric 12.

According to the embodiment, the storage node electrode 10 and the plate electrode 14 may both comprise TiN. However, it is to be understood that other conductive materials may be chosen and used as the storage node electrode 10 or the plate electrode 14 in other embodiments. For example, the storage node electrode 10 may be composed of a material selected from the group consisting of doped polysilicon, titanium nitride (TiN), tantalum nitride (TaN), tungsten (W), tungsten nitride (WN), ruthenium (Ru), ruthenium oxide (RuO2), iridium (Ir), iridium oxide (IrO2), platinum (Pt) and Ru/RuO2. The plate electrode 14 may be composed of a material selected from the group consisting of doped polysilicon, TiN, TaN, W, WN, Ru, RuO2, Ir, IrO2, Pt, Ru/RuO2.

According to the embodiment, capacitor dielectric 12 comprises silicon-doped zirconium oxide and does not contain Al2O3. According to the embodiment, the capacitor dielectric 12 is a single layer of silicon-doped zirconium oxide and may have a thickness of about 60-100 angstroms. The silicon-doped zirconium oxide can be expressed by ZrSiOx. However, it is understood that this formula (ZrSiOx) does not imply stoichiometry. The amount of silicon doped with respect to the total amount of Si and Zr in the capacitor dielectric 12 is controlled in a range between 4-9% by atomic ratio (Si/(Zr+Si)). Therefore, an approximate stochiometry of the capacitor dielectric 12 may be Zr(0.96 to 0.91)Si(0.04 to 0.09)O2. According to the embodiment, the doped silicon may be in the form of SiO2 in the crystalline capacitor dielectric 12. According to the embodiment, capacitor dielectric 12 may be as-deposited ZrSiOx and may be formed by a known method including but not limited to atomic layer deposition (ALD), metal/metal/ oxidizer (MMO), pulsed laser ablation and deposition (PLAD), and metal organic chemical vapor deposition (MOCVD).

The applicant has found that only very small amounts of SiO2 incorporation in the range of 4-9% by atomic ratio are needed to maintain low leakage. These low levels of SiOx in ZrO2 do not prohibit dielectric crystallization under low thermal treatment, so that aggressive annealing can be avoided. The aforesaid range (4-9%) is critical because too much SiO2 incorporation would lower the dielectric constant and inhibit crystallization of the capacitor dielectric 12, while too little SiO2 incorporation would lead to leakage degradation due to poor interface control (e.g., dielectric buckling and leakage fliers) and bulk degradation (e.g., dielectric cracking). Hereinafter, the term "dielectric buckling" refers to a local delamination between the dielectric and an electrode, typically due to the combination of poor adhesion and interface quality relative to differences in film stress and thermal expansion. The term "median leakage" refers to the value of the middle data point or estimated middle data point, in a distribution of data points, where ~50% of the data points are higher than the median value and 50% of the data points are lower than the median value. The term "leakage flier" refers to any outlier data points with values much larger than would be observed in a normal distribution of data, typically more than±3 standard deviations.

It is advantageous to use the present invention because higher total capacitance can be achieved from crystallization (under lower temperature thermal treatment) and low doping content, concurrently with lower leakage as compared to any pure ZrO2 or ZrO2-Al2O3 system. By adding Si to ZrO2, dielectric buckling, median leakage and leakage flier can be reduced in a controlled manner. Too much Si, however, decreases capacitance and can aggravate dispersion (decreasing capacitance versus frequency). To sum up, trace Si doping with predetermined concentration and location within ZrO2 allows high capacitance crystalline ZrO2 at low temperatures and with low leakage. In contrast, similar capacitance with low leakage cannot be achieved with pure ZrO2 or with trace Al doping. For the conventional Al-doped ZrO2 system, discrete layers of amorphous Al2O3 or amorphous ZrAlOx are needed to control leakage, and this severely limits its capacitance.

The low leakage behavior of the capacitor dielectric 12 may arise from chemical and/or physical stabilization of the crystalline ZrSiOx dielectric in contact with the TiN electrodes and with a reduction in intrinsic and extrinsic defects. XRR (X-ray reflectivity) shows uniquely higher interfacial TiOx density for as-deposited ZrSiOx on TiN compared to ZrO2 (even though bulk ZrSiOx is lower density than ZrO2 due to SiOx incorporation). It is believed that the dielectric buckling can be avoided due to higher interfacial TiOx density for as-deposited ZrSiOx on TiN. Further, it is worth noting that only the as-deposited ZrSiOx on TiN provides the higher interfacial TiOx density, while the as-deposited ZrO2, ZrO2 with O3 anneal, and ZrSiOx with O3 anneal all show similar lower interfacial TiOx density (Highest: as-deposited ZrSiOx: ~4.3 g/cm3, followed by ZrSiOx with extra O3 post-annealing, followed by ZrO2 with extra O3 post annealing, followed by as-deposited ZrO2:-4.1 g/cm3). The higher interfacial TiOx density for as-deposited ZrSiOx on TiN and better adhesion may arise by improved nucleation for the initial Zr pulse. As shown in FIGURE, the capacitor structure 1 further comprises an interfacial TiOx layer between the storage node 12 and the capacitor dielectric 14. The interfacial TiOx layer 11 may be a gradient of TiO2 and TiON.

Further, the blanket wafer BOW (blanket film stresses extracted from wafer bow measurements) data shows TiN is very tensile and that TiN oxidation from O3 annealing or during ZrO2 and ZrSiOx deposition will reduce the tensile stress, probably by replacing some of the TiN thickness with compressive TiO2. The as-deposited ZrSiOx shows more reduction in stack stress than as-deposited ZrO2. Furthermore, the adhesion scratch tests also suggest that as-deposited ZrSiOx without O3 annealing is least prone to dielectric cracking under thermal treatments and therefore shows the best leakage behavior. According to the adhesion scratch tests, the ZrO2 with O3 post-annealing was hardest (therefore most prone to cracking), while the ZrSiOx with O3 post-annealing and ZrO2 were more similar. The softest is ZrSiOx without O3 post-annealing.

Those skilled in the art will readily observe that numerous modifications and alterations of the device and method may be made while retaining the teachings of the invention.

What is claimed is:

1. A capacitor structure, comprising:
   a storage node, wherein the storage node comprises TiN;
   a capacitor dielectric on the storage node, wherein the capacitor dielectric comprising a Si-doped ZrO2 layer with a Si/(Zr+Si) content ranging between 4-9% by atomic ratio, wherein said Si-doped is in a form of SiO2 in a crystalline structure of said capacitor dielectric;
   a plate electrode on the capacitor dielectric; and
   an interfacial TiO2/TiON layer between the storage node and the capacitor dielectric, wherein said interfacial TiO2 is compressive and is directly formed in a top surface of the storage node.

2. The capacitor structure according to claim 1 wherein the capacitor dielectric does not contain Al2O3.

3. The capacitor structure according to claim 1 wherein the capacitor dielectric has a stochiometry of Zr(0.96 to 0.91)Si(0.04 to 0.09)O2.

4. The capacitor structure according to claim 1 wherein the capacitor dielectric has a thickness of about 60-100 angstroms.

* * * * *